US009125299B2

(12) United States Patent
Wittenberg et al.

(10) Patent No.: US 9,125,299 B2
(45) Date of Patent: Sep. 1, 2015

(54) COOLING FOR ELECTRONIC COMPONENTS

(71) Applicant: Apple Inc., Cupertino, CA (US)

(72) Inventors: Michael B. Wittenberg, Sunnyvale, CA (US); Nicholas G. Merz, San Francisco, CA (US); Shayan Malek, San Jose, CA (US)

(73) Assignee: APPLE INC., Cupertino, CA (US)

( * ) Notice: Subject to any disclaimer, the term of this patent is extended or adjusted under 35 U.S.C. 154(b) by 361 days.

(21) Appl. No.: 13/707,175

(22) Filed: Dec. 6, 2012

(65) Prior Publication Data

US 2014/0160684 A1     Jun. 12, 2014

(51) Int. Cl.
*H05K 7/20* (2006.01)
*H05K 1/02* (2006.01)
*H01L 23/34* (2006.01)
*H01L 23/367* (2006.01)
*H05K 1/00* (2006.01)
(Continued)

(52) U.S. Cl.
CPC .............. *H05K 1/0201* (2013.01); *H01L 23/34* (2013.01); *H01L 23/367* (2013.01); *H05K 1/0203* (2013.01); *H01L 23/3735* (2013.01); *H01L 2924/0002* (2013.01); *H05K 2201/09063* (2013.01); *H05K 2201/09781* (2013.01)

(58) Field of Classification Search
CPC ............. H05K 7/20; H05K 7/20218–7/20381; H05K 7/20409–7/20418; H05K 7/20009–7/202; H01L 23/473; H01L 23/367–23/3677; H01L 23/46–23/467; G06F 1/181–1/182
USPC ............... 361/679.46–679.54, 688–723, 760, 361/792–795, 676–678; 165/80.1–80.5, 165/104.33, 185; 174/15.1–15.3, 174/16.1–16.3, 547–548, 252, 255, 174/260–262; 257/712–722, E23.088; 24/453, 458–459
See application file for complete search history.

(56) References Cited

U.S. PATENT DOCUMENTS 4,104,523 A   8/1978   Wolfert
4,614,528 A   9/1986   Lennen
4,620,248 A   10/1986  Gitzendanner
(Continued)

FOREIGN PATENT DOCUMENTS

JP   2000252667   9/2000
JP   200422928    1/2004

*Primary Examiner* — Anthony Haughton
*Assistant Examiner* — Razmeen Gafur
(74) *Attorney, Agent, or Firm* — Brownstein Hyatt Farber Schreck, LLP (57) ABSTRACT

Examples of electronic components and printed circuit board assemblies which may be configured for directional heat transport are described herein. A circuit board assembly according to the examples herein may include a plurality of stacked planar layers, including a signal layer with a plurality of signal traces, a ground layer separated from the signal layer using an insulating layer, and a plurality of heat sink traces extending from the ground layer through at least a portion of the thickness of the insulating layer, each of the plurality of heat sink traces being electrically insulated from the signal traces and coupled to ground. The circuit board assembly may further include one or more electronic components electrically coupled to the signal layer using one or more of the signal traces, with the heat sink traces arranged around the one or more electronic components such that heat is selectively directed from one location of the board (e.g. a heat source, or hotter one of a plurality of components) to another location of the board (e.g. a perimeter of the board, or off the board).

21 Claims, 8 Drawing Sheets

(51) Int. Cl.
  *H01L 23/473* (2006.01)
  *H01L 23/373* (2006.01)

(56) References Cited

U.S. PATENT DOCUMENTS

| | | | |
|---|---|---|---|
| 4,863,499 A | 9/1989 | Osendorf | |
| 4,967,201 A * | 10/1990 | Rich, III | 342/175 |
| 4,975,761 A * | 12/1990 | Chu | 257/686 |
| 4,982,783 A | 1/1991 | Fickett et al. | |
| 5,025,336 A | 6/1991 | Morehouse et al. | |
| 5,050,038 A * | 9/1991 | Malaurie et al. | 361/720 |
| 5,148,337 A | 9/1992 | Cullen et al. | |
| 5,392,177 A | 2/1995 | Chainer et al. | |
| 5,440,172 A | 8/1995 | Sutrina | |
| 5,500,785 A * | 3/1996 | Funada | 361/720 |
| 5,586,007 A * | 12/1996 | Funada | 361/720 |
| 5,781,768 A | 7/1998 | Jones, Jr. | |
| 5,792,677 A * | 8/1998 | Reddy et al. | 438/122 |
| 5,898,573 A * | 4/1999 | Fugaro | 361/719 |
| 5,905,636 A | 5/1999 | Baska et al. | |
| 5,953,001 A | 9/1999 | Challener et al. | |
| 6,076,171 A | 6/2000 | Kawata | |
| 6,143,058 A | 11/2000 | Dahlgren et al. | |
| 6,160,705 A * | 12/2000 | Stearns et al. | 361/704 |
| 6,175,088 B1 * | 1/2001 | Saccocio | 174/262 |
| 6,212,071 B1 * | 4/2001 | Roessler et al. | 361/704 |
| 6,239,972 B1 * | 5/2001 | Tehan et al. | 361/704 |
| 6,243,269 B1 * | 6/2001 | Dibene et al. | 361/720 |
| 6,243,656 B1 | 6/2001 | Arai et al. | |
| 6,286,212 B1 | 9/2001 | Eaton | |
| 6,347,037 B2 * | 2/2002 | Iijima et al. | 361/704 |
| 6,407,595 B1 | 6/2002 | Huang et al. | |
| 6,462,410 B1 | 10/2002 | Novotny et al. | |
| 6,504,243 B1 | 1/2003 | Andric et al. | |
| 6,624,816 B1 | 9/2003 | Jones, Jr. | |
| 6,646,635 B2 | 11/2003 | Pogatetz et al. | |
| 6,687,320 B1 | 2/2004 | Chiu et al. | |
| 6,747,300 B2 * | 6/2004 | Nadd et al. | 257/288 |
| 6,778,387 B2 | 8/2004 | Fairchild | |
| 6,803,328 B2 | 10/2004 | McCullough | |
| 6,832,410 B2 | 12/2004 | Hegde | |
| 6,847,529 B2 * | 1/2005 | Dibene et al. | 361/803 |
| 6,886,625 B1 | 5/2005 | Sagal et al. | |
| 6,891,724 B2 | 5/2005 | De Lorenzo et al. | |
| 6,896,045 B2 | 5/2005 | Panek | |
| 6,930,885 B2 * | 8/2005 | Barcley | 361/719 |
| 6,956,549 B2 | 10/2005 | Naiki | |
| 6,987,671 B2 | 1/2006 | Houle | |
| 7,006,353 B2 | 2/2006 | Matteson | |
| 7,045,719 B1 * | 5/2006 | Alexander et al. | 174/262 |
| 7,045,885 B1 | 5/2006 | Chen et al. | |
| 7,085,135 B2 | 8/2006 | Chu et al. | |
| 7,125,433 B2 | 10/2006 | Garikipati et al. | |
| 7,149,909 B2 | 12/2006 | Cui et al. | |
| 7,190,585 B2 | 3/2007 | Houle | |
| 7,269,015 B2 | 9/2007 | Hornung et al. | |
| 7,295,441 B1 * | 11/2007 | Laio et al. | 361/719 |
| 7,301,755 B2 * | 11/2007 | Rodriguez et al. | 361/676 |
| 7,401,243 B2 | 7/2008 | Knepper et al. | |
| 7,433,191 B2 | 10/2008 | Blanco, Jr. et al. | |
| 7,440,281 B2 | 10/2008 | Bailey et al. | |
| 7,451,332 B2 | 11/2008 | Culbert et al. | |
| 7,454,316 B2 | 11/2008 | Bose et al. | |
| 7,532,480 B1 * | 5/2009 | Mimberg | 361/721 |
| 7,148,125 B2 | 8/2009 | Takayama et al. | |
| 7,671,282 B2 * | 3/2010 | Lee | 174/262 |
| 7,730,336 B2 | 6/2010 | Marinkovic et al. | |
| 7,782,613 B2 | 8/2010 | Harris | |
| 7,787,249 B2 * | 8/2010 | Sundstrom | 361/714 |
| RE41,637 E | 9/2010 | O'Hara et al. | |
| 7,791,597 B2 | 9/2010 | Silverstein et al. | |
| 7,800,916 B2 * | 9/2010 | Blackwell et al. | 361/790 |
| 7,805,689 B2 * | 9/2010 | Ueda et al. | 716/118 |
| 7,840,827 B2 | 11/2010 | Dahan et al. | |
| 7,866,941 B2 | 1/2011 | Li et al. | |
| 7,880,586 B2 | 2/2011 | Fagrenius et al. | |
| 7,882,369 B1 | 2/2011 | Kelleher et al. | |
| 8,115,112 B2 * | 2/2012 | Corisis et al. | 174/264 |
| 8,165,646 B2 | 4/2012 | Zheng | |
| 8,215,012 B2 | 7/2012 | Blanco, Jr. et al. | |
| 8,253,026 B2 * | 8/2012 | Strauss et al. | 174/252 |
| 8,345,414 B2 | 1/2013 | Mooring et al. | |
| 8,482,929 B2 * | 7/2013 | Slaton et al. | 361/759 |
| 8,735,728 B2 * | 5/2014 | Cheng | 174/252 |
| 2002/0043402 A1 * | 4/2002 | Juskey et al. | 174/260 |
| 2002/0114129 A1 * | 8/2002 | Dibene et al. | 361/601 |
| 2003/0053302 A1 * | 3/2003 | Kelly et al. | 361/780 |
| 2005/0077614 A1 | 4/2005 | Chengalva et al. | |
| 2006/0067054 A1 * | 3/2006 | Wang et al. | 361/704 |
| 2006/0120051 A1 | 6/2006 | Macris et al. | |
| 2006/0134831 A1 * | 6/2006 | Cohen et al. | 438/108 |
| 2006/0219385 A1 * | 10/2006 | Bell et al. | 165/80.2 |
| 2007/0212919 A1 * | 9/2007 | Clayton et al. | 439/326 |
| 2008/0049394 A1 | 2/2008 | Nishi | |
| 2009/0146975 A1 | 6/2009 | Chang | |
| 2009/0284534 A1 | 11/2009 | Hendry et al. | |
| 2010/0103147 A1 | 4/2010 | Sumpter | |
| 2010/0142155 A1 * | 6/2010 | Mertol | 361/719 |
| 2010/0195287 A1 * | 8/2010 | Sundstrom | 361/720 |
| 2010/0259908 A1 * | 10/2010 | Sutardja | 361/760 |
| 2011/0085304 A1 * | 4/2011 | Bindrup et al. | 361/718 |
| 2011/0194252 A1 | 8/2011 | Wang | |
| 2011/0311182 A1 * | 12/2011 | Meadowcroft et al. | 385/33 |
| 2012/0281354 A1 | 11/2012 | Rothkopf et al. | |
| 2015/0002769 A1 | 1/2015 | Kalyanasundaram | |

\* cited by examiner

COOLING FOR ELECTRONIC COMPONENTS

TECHNICAL FIELD

The present disclosure relates generally to cooling of electronic components, including passive cooling techniques for such components which may allow transport of heat from one location on or in the component to another location on or off the component.

BACKGROUND

Integrated circuit (IC) chips are ubiquitously used in electronic devices, for example portable or handheld devices, computers, appliances, vehicle control systems, watches, and many others. IC chips are generally fabricated on silicon wafers and packaged so that they can be incorporated into circuitry of the electronic device. Circuits may be laid out on printed circuit boards (PCBs) and circuit components, for example IC chips, may be mounted to the PCB using any conventional mount techniques, for example surface mount technology, selective soldering, and pin-in-hole reflow. The circuit components (e.g. IC chips) may be connected on the PCB using conductive traces, typically copper traces.

PCBs may vary in complexity from simple single and double-layer circuit boards to more complex multi-layer boards. Multi-layer boards are typically made of layers of an insulating substrate material, such as fiberglass reinforced epoxy, which are interleaved with signal layers that include traces connecting PCB-mounted components to other components. In multi-layer PCBs, it is generally known to route electrical signals from one layer to another layer by through-holes, or vias. Vias are holes which extend through one or more of the layers of the PCB. Vias are typically internally lined with conductive material for electrically coupling traces and/or mounting contacts to other PCB layers. The top surface of the PCB typically includes electrical contacts to which terminals of the IC chip (interchangeably referred to herein as IC package) may be connected. The PCB typically also includes one or more ground and power planes.

With the advance of technology and increasing complexity of electronic devices, such as portable devices, the IC chips and circuitry connecting those chips have become more complex and correspondingly may generate increased amounts of heat. Improved methods and systems for thermal management may be needed. While certain advancements in active cooling have been achieved, conventional techniques for passive cooling may be deficient in many regards. Examples of certain improved techniques and systems, which may provide improvement over currently known techniques for passive thermal management of printed circuit boards, are described herein.

SUMMARY

Examples of electronic components and printed circuit board assemblies are described. A circuit board assembly according to some examples herein may include a plurality of stacked planar layers. The plurality of stacked planar layers may include a signal layer with a plurality of signal traces, a ground layer separated from the signal layer using an insulating layer, and a plurality of conductive traces, interchangeably referred to herein as heat sink traces, extending from the ground layer through at least a portion of the thickness of the insulating layer, each of the plurality of heat sink traces being electrically insulated from the signal traces. The circuit board assembly may further include an electronic component electrically coupled to the signal layer using one or more of the signal traces and the heat sink traces may be arranged around the electronic component such that they extending radially outward from the electronic component.

According to other examples, a printed circuit board assembly may include a first plurality of conductive traces arranged in a first pattern around a first location on the printed circuit board, each conductive trace from the first plurality of conductive traces extending radially outward from the first location, and a second plurality of conductive traces arranged in a second pattern around a second location on the printed circuit board, each conductive trace from the second plurality of conductive traces extending radially outward from the second location, wherein each conductive trace from the first and second pluralities is connected to ground. The printed circuit board assembly may further include a first and second electrical components mounted at the first and second locations, respectively.

An electronic device according to the present disclosure may include housing, and a PCB coupled to the housing. The PCB may include a first IC package mounted to the PCB and electrically coupled to signal and power layers of the PCB, and a first plurality of conductive traces formed on a power layer of the PCB, each of said conductive traces extending from a location of the IC package to a perimeter of the PCB. The electronic device may include a second IC package, and the first plurality of conductive traces may be arranged such that the conductive traces direct heat generated by the first IC package away from the second IC package. A second plurality of conductive traces may be provided around the second IC package to further facilitate heat transport away from the second IC package. The electronic device may be a portable or a handheld device, however the examples herein are equally applicable to any electronic devices using printed circuit boards.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several examples in accordance with the disclosure and are, therefore, not to be considered limiting of its scope, the disclosure will be described with additional specificity and detail through use of the accompanying drawings, in which:

DETAILED DESCRIPTION

In the following detailed description, reference is made to the accompanying drawings, which form a part hereof. In the drawings, similar symbols typically identify similar components, unless context dictates otherwise. The illustrative examples described in the detailed description, drawings, and claims are not meant to be limiting. Other examples may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are implicitly contemplated herein.

The term "chip," as used herein, is intended to cover any integrated circuit on any substrate. Likewise, the terms "board" and "PCB," as used herein are intended to cover any suitable substrate, including flexible substrates and the like.

Figure 1:
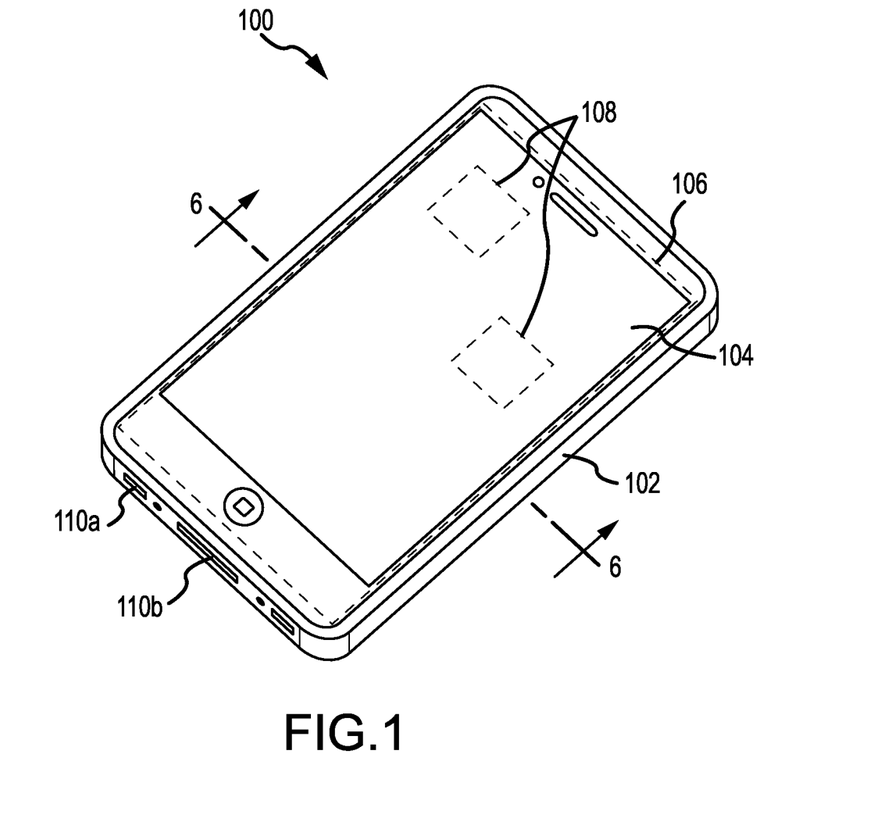
FIG. 1 is an isometric view of an example electronic device incorporating a printed circuit board assembly according to the present disclosure.

As complexity of IC chips and corresponding circuitry laid on PCBs continues to increase, the need for efficient thermal management also increases. As the density of chips and circuitry on a PCB increases, the amount of heat generated and which may need to be dissipated also increases. In some instances, certain electronic devices may rely solely or primarily on passive cooling (e.g. cooling without power consumption). Certain electronic devices may include active cooling components, such as fans, coupled with passive cooling components, such as heat sinks. However, aside from additional costs for such active cooling, space consideration in portable electronic devices may limit the ability to incorporate active cooling components. For example, a portable electronic device 100, as shown in FIG. 1, may include a housing 102, a display 104, and circuitry provided on one or more printed circuit boards (PCB outline 106 shown in phantom) enclosed within the housing 102. In some embodiments, all or part of the housing 102 may be made from a conductive material such as aluminum. The PCB may also include one or more IC chips 108 (shown in phantom), which may take the form of processor chips, memory devices, radio frequency transceivers (RF chip), and others. The internal components of the electronic device 100 may be substantially enclosed within the housing 102, and openings 110a, 110b through the housing may be provided for acoustic input and output and for connecting to input/output connectors or for delivering power to the device from an external source. The portable electronic device 100 may have minimal or substantially no airflow through the housing of the device. The device 100 in this example may rely primarily on passive cooling, for example by transporting and distributing heat evenly or selectively throughout the PCB and by further transporting heat to the housing 102 for convecting the heat to the ambient environment through the housing 102, a dedicated part of the housing, a port or the like.

Figure 2A:
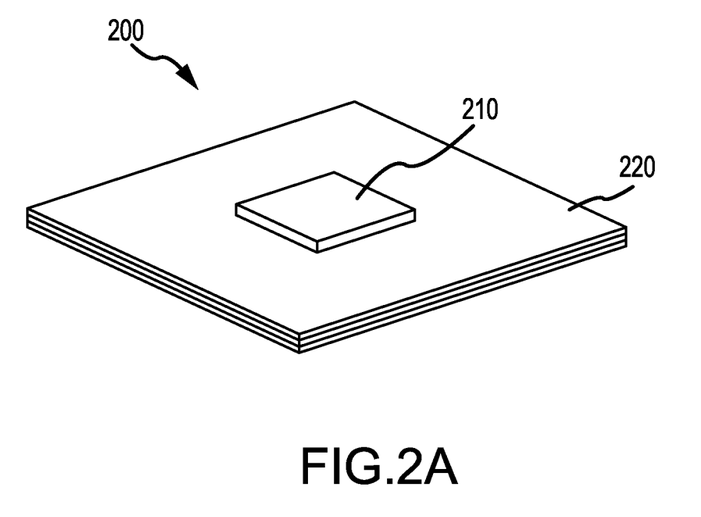
FIGS. 2A and 2B are isometric and exploded views of a printed circuit board assembly according to one example of the present disclosure.
Figure 2B:
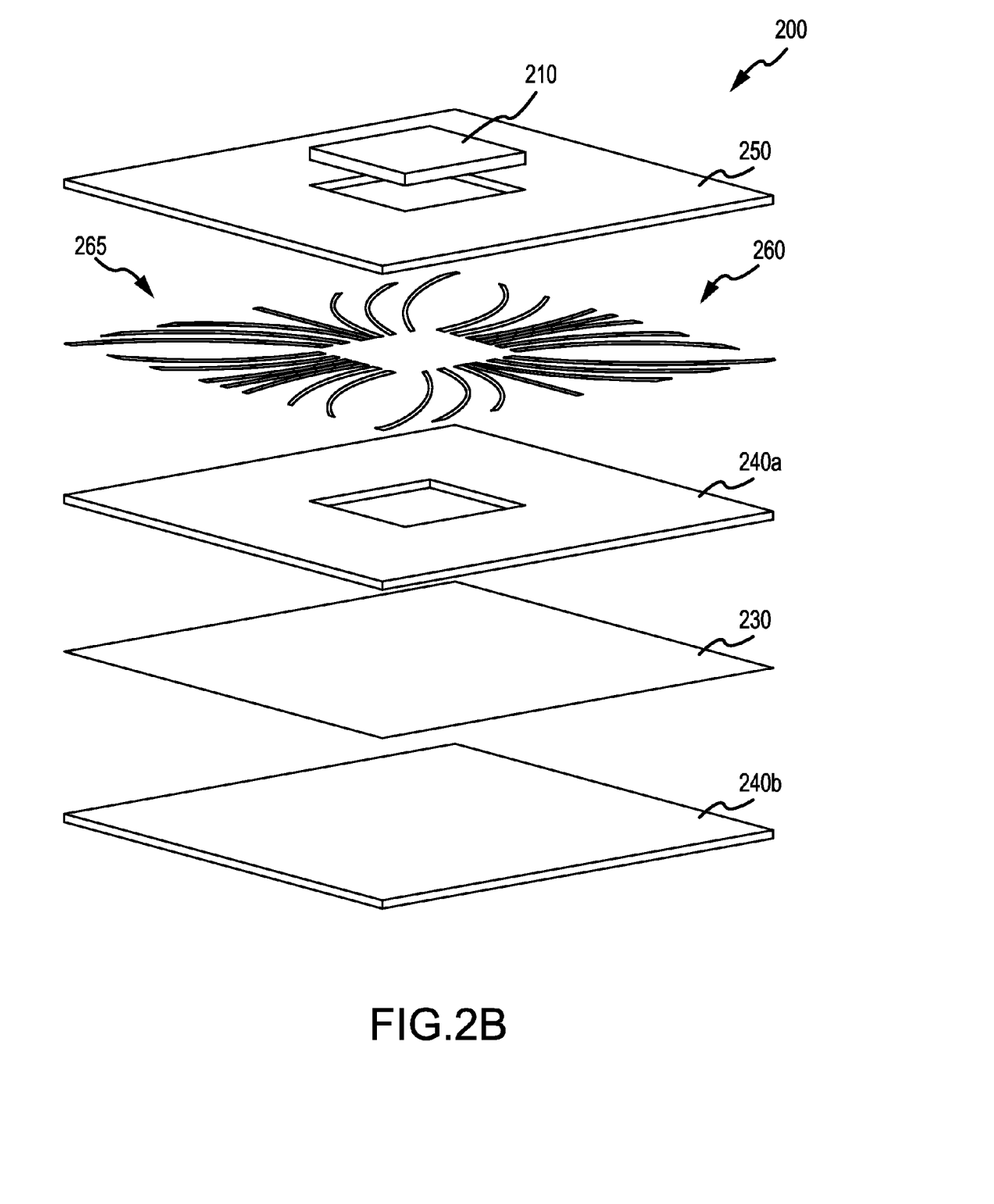

Referring now to FIGS. 2A and 2B, a PCB assembly 200 according to examples of the present disclosure is described in further detail below. As discussed, a multi-layer board may be used to connect a plurality of electronic components (e.g. electronic component 210) mounted on or through the board. A single component is depicted in this example for illustration only. However, it will be understood that the board may have additional components attached to or defined on it. The electronic component 210 may be any type of IC chip, such as a processor, a memory device, a input output (I/O) interface device, communication device (e.g., RF chip) or others. The electronic component 210 may be attached to the board 220 using any conventional mounting technique, such as surface mount, pin through hole, and others. Pins of the component 210 may be coupled using vias to any of the layers of the board 220 for electrically coupling the component 210 to circuitry on the board. For example, the component 210 may be directly connected to a copper signal layer 230 which may be insulated from other conductive layers of the board using insulator layers 240a, 240b. The signal layer 260 may include individual copper traces that route data, power or other signals between various elements (e.g., components) attached to the board 220 or to edges of the board, such as a connector, pin pad or the like. It should be appreciated that alternative embodiments may have multiple signal layers and that particular traces may move between different signal layers without interruption. In many embodiments, traces may be formed on an outer surface of the board 220. Likewise, although copper traces/layers are discussed, it should be appreciated that any suitable conductive material may be employed.

The insulator layers 240a, 240b may be made of a glass-reinforced epoxy laminate, such as FR4, an insulating plastic or polymer such as TEFLON, porcelain, silicon dioxide or other oxides, rubber, certain ceramics, certain composites or other suitable insulators known in the art or later developed. Accordingly, it should not be considered that the foregoing is an exhaustive list of suitable insulators, but instead is merely illustrative. Any insulator known to those skilled in the art now or that is later developed may be used. For clarity of illustration one or more layers may be omitted in the examples depicted herein, and additional layers and/or components may be included in other examples. The printed circuit board (e.g. board 220) may include any number of conductive layers, including signal layers and power distribution layers. In the example depicted in FIGS. 2A-2B, two conductive layers are depicted, including the signal layer 230 and a ground layer 250. The ground layer 250 is insulated from the adjacent signal layer 230 using the insulator layer 240a, and a second insulator layer 240b is disposed on the opposite side of signal layer 230 thereby insulating signal layer 230 from other conductive layer of the board 220 (not show here for clarity). As will be understood, although the signal layer 230 is depicted for ease of illustration as a continuous layer at the signal plane, the signal layer may instead be implemented as a plurality of signal traces corresponding to the desired circuitry laid out on the board 220.

The ground layer 250, which may be made of a conductive material like copper, may be a continuous layer or may be formed from one or more areas that may be contiguous and/or discontinuous. Further, the ground layer 250 may be smaller in one or more dimensions than other layers and/or the board 200 itself. Generally a large surface area may be used for the ground plane, often taking up an entire layer or multiple layers on a multi-layer board. One reason for using large ground planes may be to reduce electrical noise and interference that may be coupled from one part of the circuit to another, such as through one or more ground loops, as well as crosstalk between adjacent circuit traces. Although a generally large ground plane may be desired, conductive material may be selectively used along the ground plane to tailor the flow path of heat across the ground layer provided such thermal management technique does not adversely impact the electromagnetic compatibility of the circuitry on the board. It should be understood that a "large" ground plane is relative to the overall size of the substrate and/or electrical component.

According to certain embodiments and as depicted in FIG. 2, the ground layer 250 may include a plurality of conductive traces 260 arranged in a pattern 265. The pattern 265 may be selected to control the direction of heat transport along the ground layer 250. For example, in the absence of the conductive traces 250 the region at and around the component 210 may be significantly hotter than other regions on the board, such as a perimeter of the board, due to the heat generated by the IC chip (e.g. component 210). It may be useful to prevent or reduce heat concentration at one or more particular locations on (or in) the board and, thus, it may be useful to dissipate the heat throughout the board and/or direct it to a particular location on or off the board, as will be further described. Fanned traces of a thermally conductive material (e.g. conductive traces 260, interchangeably referred to herein as "heat sink traces"), may be used to draw heat from the hot location (e.g. the location of the heat source, represented here by component 210) and direct the heat to other locations on the board. Certain locations to which heat is directed may be further configured to facilitate transport of the heat off the board as will be further described below, for example by conducting the heat to the housing and or other heat transfer devices (e.g., heat sinks, heat spreaders, and others).

The heat sink traces 260 may be arranged according to any suitable pattern 265, 275 to facilitate directionality of heat transport. In the example in FIGS. 2A-2B, the heat sink traces 260 fan out or extend radially outward from the location of the component 210. The heat sink traces 260 may be equally spaced and/or arranged in an optionally regular radial pattern around the component 210. In other examples, the heat sink traces 260 may be arranged in an irregular pattern and may be selectively grouped in a particular location or a plurality of locations to increase heat transport in that location. The density and/or thickness of the traces may be varied to further tailor the directionality and thermal capacity of the heat sink traces 230. The example pattern 265 depicted in FIG. 2 is illustrative only, and many other patterns may be used. The individual heat sink traces may be straight, curved or shaped in any complex shape to direct heat in a particular direction or to pass around other components.

Figure 3A:
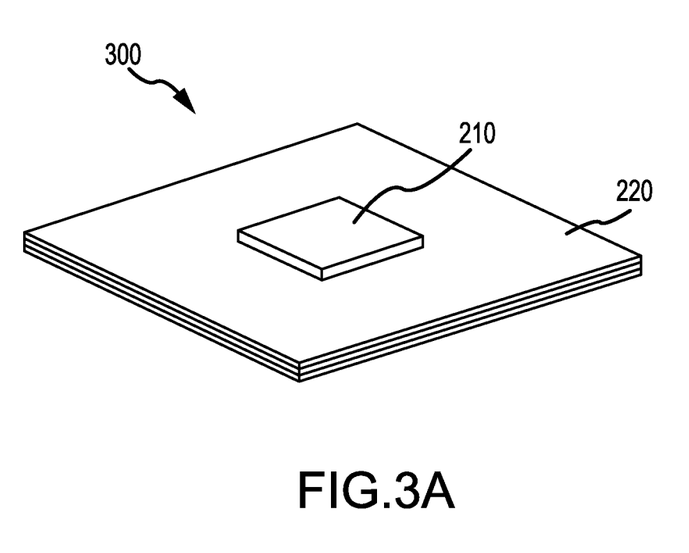
FIGS. 3A and 3B are isometric and exploded views of a printed circuit board assembly according to another example of the present disclosure.
Figure 3B:
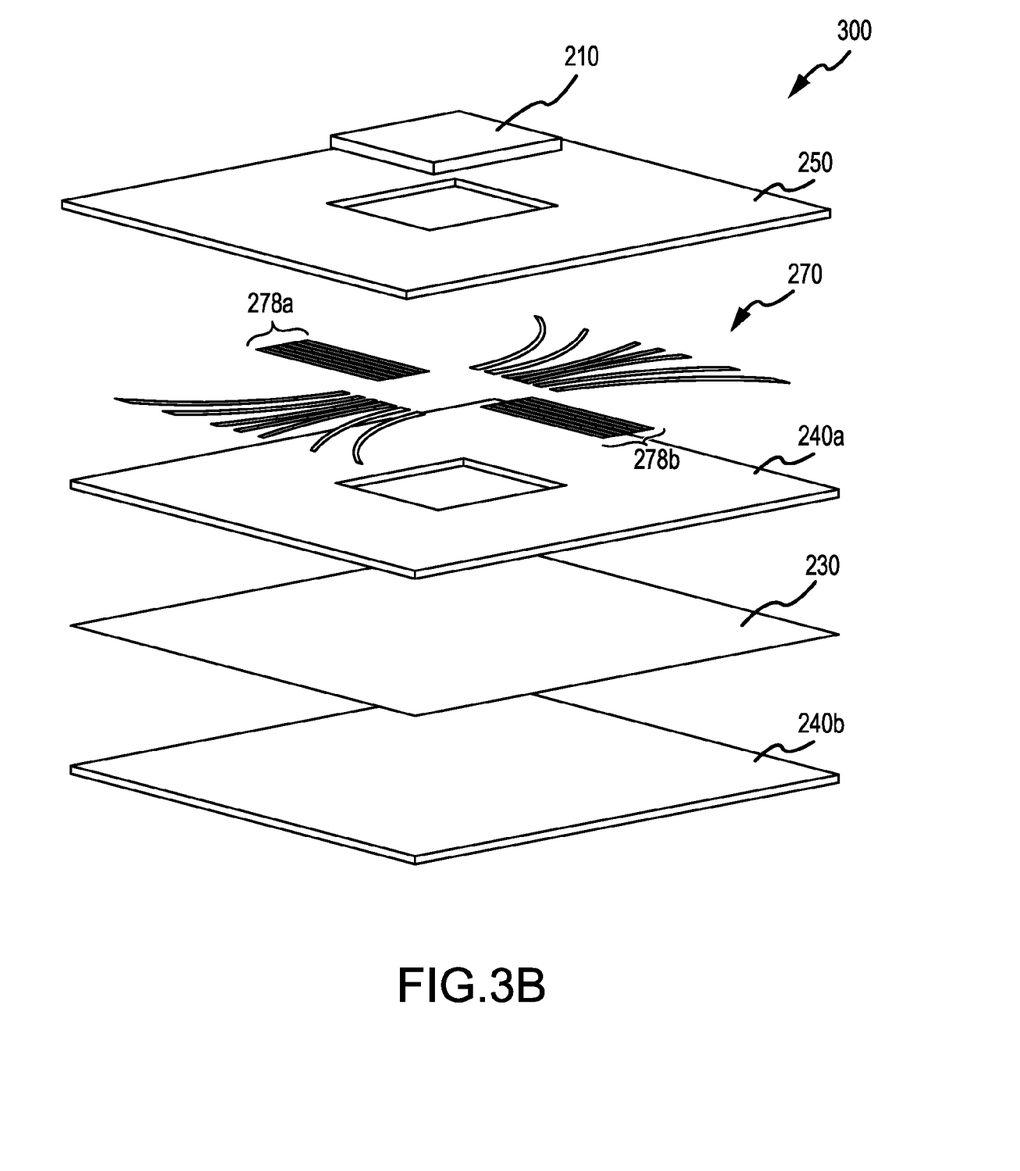

Another example according to the present disclosure is shown in FIGS. 3A and 3B, in which example a grouping of heat sink traces 278a or a single, potentially wider heat sink trace may be used to direct heat to a specific location on the board, such as the perimeter of the board 220. A second grouping of heat sink traces 278b may be used to direct heat to another location, for example the opposite side of the board 220. Further, the plurality of heat sink traces (e.g. conductive traces 270) may be grouped and/or arranged according to virtually any desired pattern to provide directionality and/or additional capacity for heat transport. The board 220 may include heat collecting regions (not shown), which will be further described with reference to FIGS. 5 and 6.

Figure 4A:
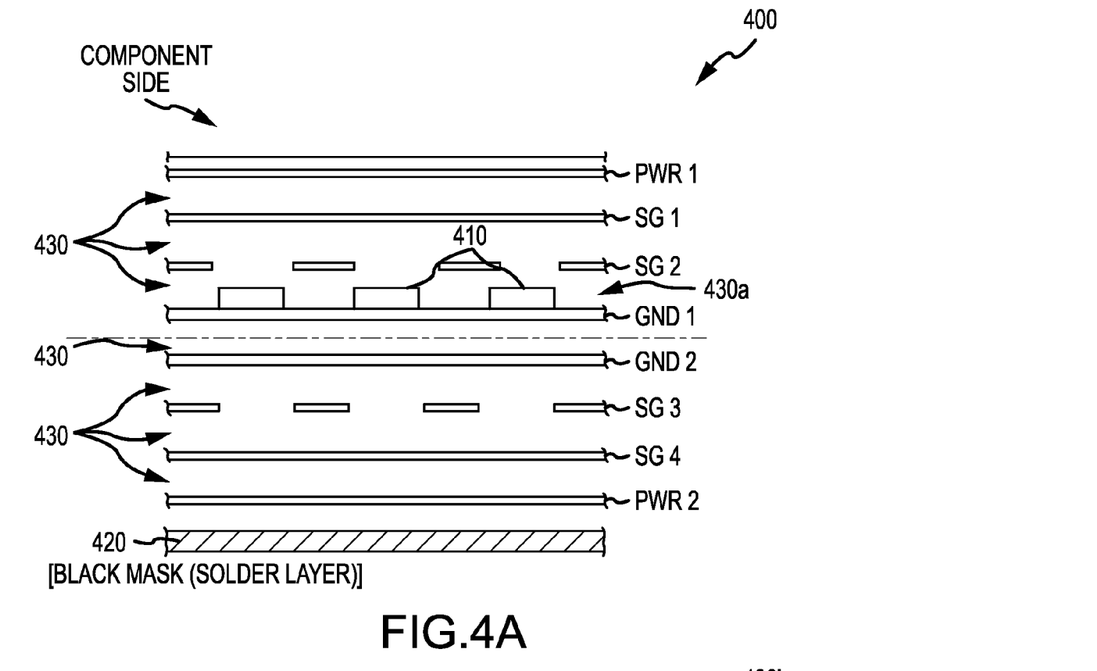
FIGS. 4A and 4B are cross-sectional schematic illustrations of example printed circuit boards according to the present disclosure.

The electronic component 210 (e.g. processor chip, RF chip or other IC package) may be coupled to the PCB using one or more connectors, such as pins or solder balls, which may be formed in a ball grid array. Some of the connectors may be signal connectors for connecting the IC chip to the signal layer 230 and for carrying signals to and from the signal layer 230, while other connectors may be thermal connectors only, and may carry no signals but may transmit heat. The thermal connectors may be coupled to the power distribution layers of the board and may serve to supply current or to ground the IC chip, as well as conduct heat from the IC chip to the power distribution layers. While certain examples of patterned heat sink traces associated with the ground layer are described herein, similar directional heat transport may be achieved by incorporating conductive traces with the power delivery layer (e.g. PWR 1 and PWR 2 layers, as shown in FIG. 4A). It will be further understood that the heat sink traces may be located on either side of the ground or power layers, and they may be buried or exposed depending on whether the ground or power layers are external or internal layers of the board.

Figure 4B:
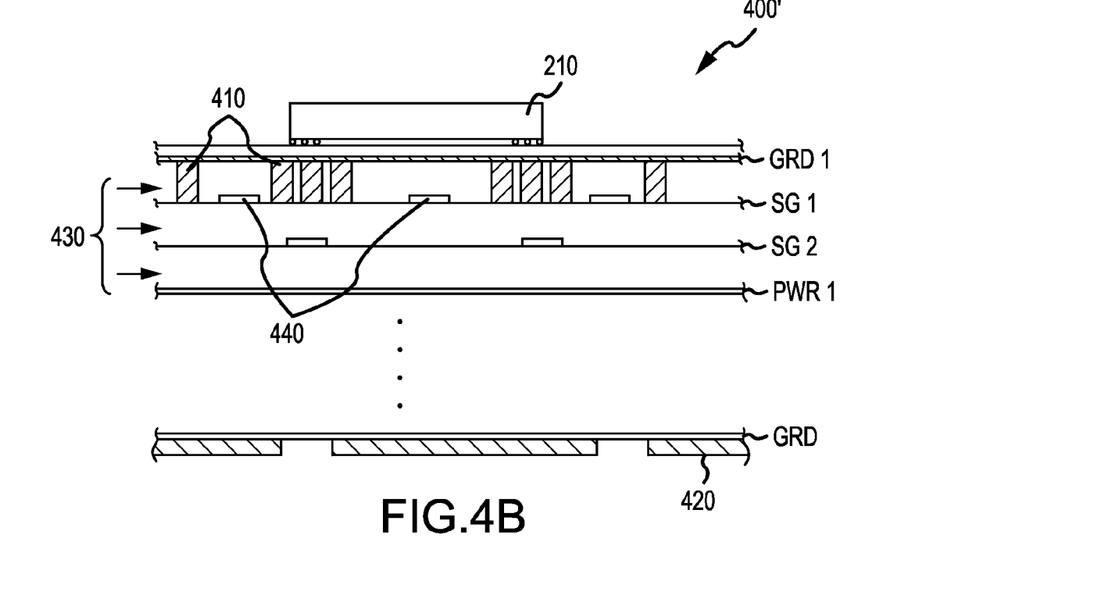
Figure 5:
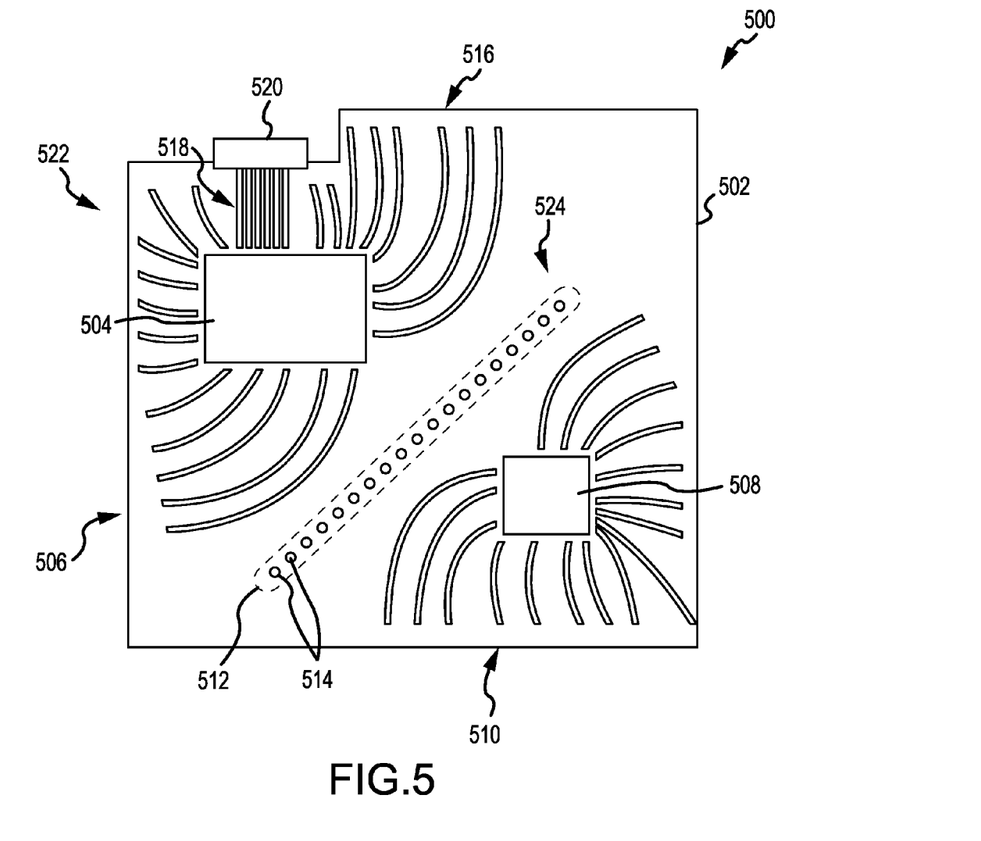
FIG. 5 is a simplified plan view of a circuit board assembly according to examples of the present disclosure.

Referring now to FIGS. 4-5, examples of PCB stack-ups according to the present disclosure will be described in further detail. A PCB stack-up according to the present disclosure may include any number of alternating conductive and insulating layers. As described herein, some of the conductive layers, which may be copper layers, may serve as signal layers while others of the conductive layers may be used for power distribution (e.g., power and ground layers). The power and ground layers may interchangeably be referred to herein as power and ground planes, respectively, owing to the fact that they may be implemented as continuous planer layers of a conductive material.

FIG. 4A shows a schematic illustration of a PCB stack-up 400 according to one example of the present disclosure. The PCB stack-up in the example in FIG. 4A is an 8 layer stack-up including 2 ground (e.g. GRD 1, GRD 2), 2 power (PWR 1, PWR 2), and 4 signal (SG 1, SG 2, SG 3, and SG 4) layers. Adjacent signal layers, SG 1 and 2, and SG 3 and 4 may include signal traces, which may be laid out along orthogonal directions in some examples, for minimizing signal interference. Other conventional electromagnetic compatibility (EMC) techniques may be employed to prevent or minimize electromagnetic interference (EMI). Heat sink traces 410 may be formed on the ground plane, which heat sink traces 410 may extend from the ground layer GRD 1 through some or all of the thickness of the insulating layer 430a sandwiched therebetween. The heat sink traces 410 may be formed on one or both sides of the ground layer GRD 1 such that they extend in either one or both directions generally perpendicular to the ground plane. It may be advantageous, from a mechanical perspective, to include heat sink traces 410 symmetrically around the center plane of the PCB, for example to prevent warping of the board. While heat sink traces 410 are shown only on one of the ground planes (e.g. GRD 1) in the present example, another plurality of heat sink traces may also be provided on the second ground plane (e.g., GRD 2), and/or on one or both of the power planes (PWR 1, PWR 2).

Any other number of layers and alternating arrangement of the layers may be used in the examples herein. In some embodiments, fewer than 8 layers may be used. In other embodiments, the stack-up may include 10 layers or more for accommodating additional signal routing, for example. Two additional signal layers may be inserted between the two ground layers (e.g. layers GRD 1 and GRD 2 in FIG. 4A), as one example. In other examples, other arrangements for the signal and ground layers may be used. For example, the ground plane may be the third layer on a 10 layer board, having a stack-up of SG 1, SG 2, GRD 1, SG 3, PWR 1, PWR 2, SG 4, GRD 2, SG 5, and SG 6. It should be appreciated that the ground layer may be positioned at any depth in the stack-up (e.g., may be any number layer in the stack-up). A solder layer or solder mask may be provided adjacent the bottom signal layer (e.g., SG 6 layer). Bond pads, for example for mounting components thereto, may be provided at the bottom solder layer and/or the top layer (e.g., the first signal layers SG 1).

FIG. 4B shows yet another example of a PCB stack-up 400' according to the present disclosure. In this example, heat sink traces 410 are connected to an underside of the ground layer GRD 1, which may be made of copper. The heat sink traces 410 in this example extend through the thickness of insulating layer 430, which may be an FR4 layer. The heat sink traces may be interspersed with the signal traces and are electrically insulated from signal traces 440 by virtue of the insulating material of layer 430. The heat sink traces 410 are connected to ground and may in this regard further serve to provide EMI shielding for any signal traces therebetween. In some examples, and because heat may accumulate below the component 210, the heat sink traces may originate and extend outward from an area below the component 210.

FIG. 5 shows a simplified plan view of a circuit board assembly 500 according to another example of the present disclosure. The circuit board assembly 500 may include a printed circuit board 502 (also referred to as board 502), which may be implemented according to any of the examples herein. The board 502 may include a plurality of alternating conductive layers separated by insulating layers. In the present example, multiple sets of fanned out or radially extending traces 506, 510 (e.g. heat sink traces) may be used to provide a directionality of heat transport and/or dissipation on the printed circuit board. For purposes of illustration, a simplified schematic of a PCB is depicted in FIG. 5 in which some components, which may not be necessary for understanding the present examples, have been omitted. The printed circuit board 502 may include a first component 504 and a second component 508. The first component 504 may be a processing chip, which may generate a significant amount of heat when power is being supplied to the board 502 and the chip is in operation. In this regard, the first component may be referred to as the "hot chip." The second component 508 may be integrated circuit chip with other functionality, for example a radio frequency transducer (RF chip). The second component 508 may also generate heat when powered but in certain examples the second component 508 may generate less heat than the first component 504. In this regard the second chip may be referred to as the "cooler chip." In some instances it may be desirable to maintain the cooler chip at a lower temperature than may otherwise be possible given natural heat transfer principles and the board tending towards equilibrium. In this regard it may be advantageous to direct heat generated by the hot chip (e.g., first component 504) away from the cooler chip (e.g., second component 508).

Such directionality may be achieved by using a plurality of conductive traces 506 arranged around the hot chip such that heat is selectively transported from the hot chip and towards a region away from the cooler chip, as indicated by pattern 522. Although the conductive traces (and all traces) are shown on an exterior surface of the board 502, the traces may be present at any layer of the stack-up. They are shown as being on the surface for illustrative purposes only. In further examples, a second plurality of conductive traces 510, may be provided around the second component 508 to further direct and distribute heat throughout the board. A thermal barrier region 524 may be defined between the first and second components 504, 508 by virtue of heat being generally directed away from the region 524 via the first and second plurality of fanned-out heat sink traces. Thermal separation between the location of the first component 504 and the location of the second component 508 may be enhanced by forming one or more slots 512 through the board 502 for inhibiting heat transfer across the thermal barrier region 524. Alternatively, a pattern of micro-perforations 514 may be used to minimize the risk of the slot 512 accidentally functioning as an antenna. For example, for signal frequencies of about 5 GH, the micro perforations 514 may have a diameter not exceeding about 1.5 mm.

As described with reference to FIGS. 3A-3B, a bundle 518 of heat sink traces or a wide strip of a conductive material may be used to direct heat to a specific location on the board or perimeter of the board, to which other heat dissipating components may be mounted. For example, heat may be piped via the bundle 518 to the metal component 510 which may be a heat sink extending from the side of the printed circuit board. In other examples, and as further described with reference to FIG. 6, heat may be piped to virtually any other grounded metallic component of the portable device 100.

Figure 6:
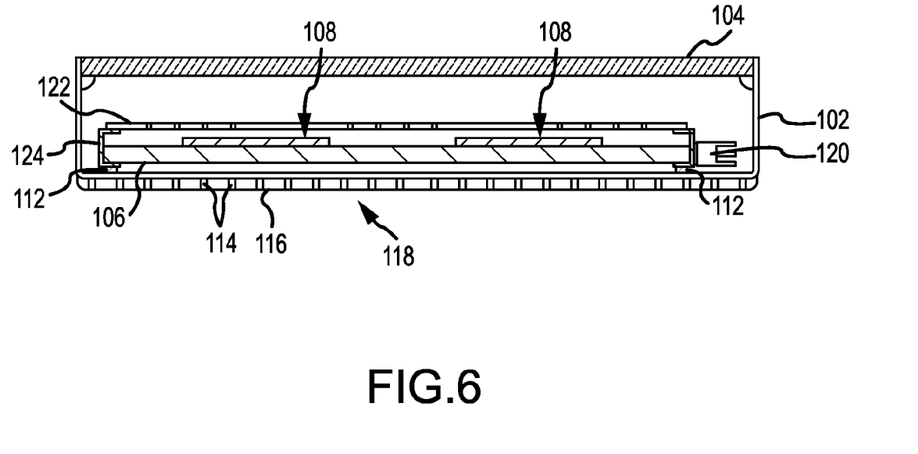
FIG. 6 is a simplified cross-sectional view of the electronic device in FIG. 1 taken along the line 6-6.

Further advantages of the examples herein may be appreciated with reference to FIG. 6, which shows a simplified cross section of the portable electronic device 100 in FIG. 1 taken along the line 6-6. As shown in FIG. 6, the printed circuit board 106 may be coupled to the housing 102 of the device via the attachment structures or standoffs 112. As described herein, heat sink traces may be used to direct heat towards the attachment structures (e.g. standoffs 112), which may transfer the heat from the board 106 to the housing 102 of the device. The housing 102 may typically be made from a conductive material and used for passive cooling the internal components of the device, including the board 106, and circuitry thereon. The housing 102 may include additional heat dissipation devices, such as outwardly extending fins 114 attached to an exterior surface of the housing 102. The fins 114 may be thin structures extending a short distance, for example 5-10 mm, from the surface of the housing. The fins 114 may be covered with a protective layer 116, such as a film of plastic material which may be sufficiently rigid to protect the fins 114 from damage. In this regard, the finned structure 118 may increase the surface area of the housing available for dissipating heat to the ambiance. As will be understood, the finned structure 118 may be integral with the housing 102 or may be a separate component configured to attach thereto. Also as described, heat may be directed to virtually any other grounded metallic structure, which may include the faraday cage of the device (e.g., shield can 122 and/or edge plates 124 of the shield can). Heat may also be selectively directed towards one or more bond pads or plated mounting holes on the board to which other a passive (e.g., heat sink 120) or active cooling components are attached.

Circuit boards (e.g. board 106, 220, etc.) may be formed using any techniques for the manufacture of printed circuit boards currently known or later developed. A laminate of insulating material may be formed by curing a resin impregnated cloth or paper, also referred to as pre-preg. The laminate, which may be FR-4 grade laminate or other fiber reinforced composite material, may be formed into a copper-clad laminate by applying a copper foil to one or both sides of the laminate. The copper foil may be adhered to the laminate using epoxy. The thickness of the copper foil may vary and may be generally constant throughout. Copper traces are typically formed by a subtractive process (e.g. etching). Double-sided or multi-layer boards use plated through holes or vias to connect traces on different layers of the PCB. An additive process may be used to add the desired copper traces to an insulating substrate as well as to form the plated through holes or vias which connect certain ones of the conductive layers.

One or more copper-clad layers may be used and desired pattern of signal traces etched thereon. On top and bottom sides of the etched copper clad laminate additional insulating layers (e.g. prepreg) may be applied and cured to form additional layers. Copper foil may be applied to the new top and bottom layers and etched again, or the multi-layer board may be drilled plated and etched again to form additional traces (e.g. signal layers). When a desired number of layers are obtained, the PCB may be covered with a solder mask and/or any other surface finish as may be desired. The thickness of the PCB may depend on the total number of layers, but in some examples it may range from about 0.5 mm to about 1 mm. An example 8 layer board according to the present disclosure may be about 0.75 mm thick.

Heat sink traces may be formed on a conductive ground or power layer by an additive process of depositing additional copper to the already existing layer of copper. In the alternative, a pattern of trenches or slots may be micro machined in a desired pattern of the heat sink traces through a portion or the full thickness of the insulator layer (e.g. a cured pre-preg layer). Conductive material, such as copper may then be deposited into the machined pattern to form radially extending fins for directional heat transport as described herein. This technique may be used with an external ground layer or an internal ground layer, by machining micro slots and depositing conductive traces therein prior to addition additional layer over the internal ground layer. The techniques for forming heat sink traces on the power plane of a PCB described herein are illustrative only, and other techniques may be used or appreciated in light of the present disclosure.

While various aspects and examples have been disclosed herein, other aspects and examples will be apparent to those skilled in the art. The various aspects and examples disclosed herein are for purposes of illustration and are not intended to be limiting, with the true scope and spirit being indicated by the following claims.

What is claimed is:

1. A circuit board assembly comprising:
   a plurality of stacked planar layers including:
   a signal layer having a plurality of signal traces;
   an insulating layer adjacent the signal layer;
   a power distribution layer separated from the signal layer by the insulating layer; and
   a heat sink trace formed from a conductive material and being electrically insulated from the signal traces, wherein:
   the heat sink trace extends from a surface of the power distribution layer into the insulating layer; and
   the heat sink trace is adapted to transfer heat away from an electronic component associated with the circuit board assembly.

2. The circuit board assembly of claim 1, wherein:
   the electronic component is electrically coupled to the signal layer using one or more of the signal traces; and
   the heat sink trace is part of a group of heat sink traces arranged around at least a portion of a perimeter of the electronic component and extending outward from the electronic component.

3. The circuit board assembly of claim 1, wherein at least some of the signal traces are interspersed with the heat sink trace.

4. The circuit board assembly of claim 1, wherein the heat sink trace extends through the insulating layer.

5. The circuit board assembly of claim 1, wherein the heat sink trace is connected to a passive cooling component mounted to the circuit board.

6. The circuit board assembly of claim 1, wherein:
   the power distribution layer is a first power distribution layer;
   and the circuit board further comprises a second power distribution layer having a second group of heat sink traces.

7. The circuit board assembly of claim 6, wherein:
   the heat sink trace is one of a first group of heat sink traces; and
   the first group of heat sink traces and the second group of heat sink traces are arranged are arranged in respective first and second patterns mirrored about the center plane of the circuit board.

8. A printed circuit board assembly comprising:
   a circuit board;
   a first electrical component mounted in a first location on the circuit board;
   a first group of conductive traces arranged in a first pattern proximate to the first location;
   a second electrical component mounted in a second location on the circuit board; and
   a second group of conductive traces arranged in a second pattern proximate to the second location on the printed circuit board; and
   a region defined between the first and second locations wherein, each conductive trace from the first and second groups are adapted to transfer heat away from the region.

9. The printed circuit board assembly of claim 8, wherein all of the conductive traces from the first group and the second group extend outward towards a perimeter of the printed circuit board.

10. The printed circuit board assembly of claim 8, wherein the first electrical component is mounted to one side of the printed circuit board and the second component is mounted to the opposite side of the printed circuit board.

11. The printed circuit board assembly of claim 8, wherein one or more perforations or slots are formed through a portion of the printed circuit board in the region.

12. The printed circuit board assembly of claim 8, wherein at least some of the conductive traces from the first or second group are formed on a signal layer of the printed circuit board and interspersed between signal traces configured to carry signals to or from the first or second electrical components.

13. An electronic device comprising:
    a housing;
    a printed circuit board (PCB) coupled to the housing and including:
    a first integrated circuit (IC) mounted to the PCB and electrically coupled to a power layer or a ground layer of the PCB; and
    a first group of conductive traces extending from a surface of the power layer or ground layer of the PCB, at least one of said conductive traces extending from a location of the IC package to a perimeter of the PCB.

14. The electronic device of claim 13, wherein the PCB is coupled to the housing using an attachment structure, and wherein at least some conductive traces of the first group of conductive traces extend from the location of the first IC package to the attachment structure, the at least some conductive traces being electrically coupled to the attachment structure.

15. The electronic device of claim 13, further comprising a second IC package, and wherein the first group of conductive traces are arranged such as to direct heat generated by the first IC package away from the second IC package.

16. The electronic device of claim 13, further comprising a second IC package, the second IC package generating less heat than the first IC package when power is supplied to the PCB.

17. The electronic device of claim 16, further comprising a second group of conductive traces arranged in a radial pattern around the second IC package and extending towards the perimeter of the PCB.

18. The electronic device of claim 13, wherein at least some conductive traces of the first group of conductive traces are electrically coupled to a passive cooling component.

19. The electronic device of claim 18, wherein the passive cooling component is a heat sink, an electromagnetic interference shield structure, or a PCB standoff.

20. The electronic device of claim 13, wherein the electronic device is a handheld device.

21. The electronic device of claim 20, wherein the first group of conductive traces is configured to transport heat to the housing of the handheld device.

* * * * *